(12) United States Patent
Watanabe et al.

(10) Patent No.: US 10,316,780 B2
(45) Date of Patent: Jun. 11, 2019

(54) CONTROLLER AND ABNORMALITY DETECTING METHOD OF AIR-FUEL-RATIO SENSOR

(71) Applicants: FUJITSU TEN LIMITED, Kobe-shi, Hyogo (JP); TOYOTA JIDOSHA KABUSHIKI KAISHA, Toyota-shi, Aichi-ken (JP)

(72) Inventors: Masatoshi Watanabe, Kobe (JP); Shigeto Umeyama, Kobe (JP); Motoki Komiya, Kobe (JP); Keisuke Kido, Kobe (JP); Chiharu Morisaki, Kobe (JP); Hiroto Miura, Toyota (JP)

(73) Assignees: FUJITSU TEN LIMITED, Kobe-shi (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/637,464

(22) Filed: Jun. 29, 2017

(65) Prior Publication Data
US 2018/0023494 A1   Jan. 25, 2018

(30) Foreign Application Priority Data

Jul. 20, 2016 (JP) .................................. 2016-142771

(51) Int. Cl.
*F02D 41/14* (2006.01)
*F01N 11/00* (2006.01)
(Continued)

(52) U.S. Cl.
CPC ........ *F02D 41/1495* (2013.01); *F01N 11/007* (2013.01); *F02D 41/1402* (2013.01);
(Continued)

(58) Field of Classification Search
CPC ............... F01N 11/007; F02D 41/1495; F02D 2041/2086; F02D 2041/2089;
(Continued)

(56) References Cited

U.S. PATENT DOCUMENTS 4,223,549 A * 9/1980 Kitzinger ................. G01D 3/08
204/401
6,384,386 B2 * 5/2002 Hashimoto .......... G01N 27/122
123/697
(Continued)

FOREIGN PATENT DOCUMENTS

EP     1677103 A2    7/2006
JP     2005-291991 A   10/2005
(Continued)

*Primary Examiner* — Sizo B Vilakazi
*Assistant Examiner* — Kevin R Steckbauer
(74) *Attorney, Agent, or Firm* — Oliff PLC

(57) ABSTRACT

A controller of an air-fuel-ratio sensor includes a control unit, a voltage-abnormality detecting unit, and a short-circuit-abnormality detecting unit. The control unit controls a current and a voltage of a gas sensor element through a plurality of terminals connected with the gas sensor element. The voltage-abnormality detecting unit changes, when at least one of voltages of the plurality of terminals is out of a predetermined range, a voltage level of an output voltage. The short-circuit-abnormality detecting unit causes, when the voltage level of the output voltage changes from a first voltage into a second voltage, a control unit to perform for a predetermined time a protective operation that suppresses currents from the control unit to the plurality of terminals, and detects, when the voltage level of the output voltage is the second voltage after the protective operation is released, a short-circuit abnormality.

3 Claims, 5 Drawing Sheets

(51) Int. Cl.
*G01D 3/028* (2006.01)
*G01D 3/08* (2006.01)
*G01R 31/02* (2006.01)
*F02D 41/20* (2006.01)

(52) U.S. Cl.
CPC ..... *F02D 41/1454* (2013.01); *F02D 41/1456* (2013.01); *G01D 3/028* (2013.01); *G01D 3/08* (2013.01); *G01R 31/02* (2013.01); *F02D 2041/2093* (2013.01)

(58) Field of Classification Search
CPC ......... F02D 2041/2093; F02D 41/1479; F02D 41/148; G01R 31/02
See application file for complete search history.

(56) References Cited

U.S. PATENT DOCUMENTS

| | | | | |
|---|---|---|---|---|
| 7,142,976 B2* | 11/2006 | Inoue | ................ | G01N 27/4175 701/114 |
| 7,713,391 B2* | 5/2010 | Inoue | ................ | F02D 41/1494 123/688 |
| 8,508,895 B2* | 8/2013 | Naik | .................. | G01D 3/08 361/58 |
| 9,109,527 B2* | 8/2015 | Barnikow | ........... | F02D 41/1477 |
| 9,494,547 B2* | 11/2016 | Tsukada | ................ | G01N 27/407 |
| 2002/0000436 A1* | 1/2002 | Hashimoto | .......... | G01N 27/122 219/497 |
| 2004/0195097 A1* | 10/2004 | Suzuki | ............... | G01N 27/4071 204/426 |
| 2005/0288847 A1* | 12/2005 | Inoue | ................ | G01N 27/4175 701/114 |
| 2006/0157348 A1* | 7/2006 | Inoue | .................. | F02D 41/1494 204/401 |
| 2011/0199709 A1 | 8/2011 | Ieda | | |
| 2012/0001641 A1* | 1/2012 | Tsukada | ............ | G01N 27/4065 324/537 |
| 2012/0250192 A1* | 10/2012 | Naik | ....................... | H02H 9/08 361/42 |
| 2012/0266647 A1* | 10/2012 | Barnikow | ........... | F02D 41/1477 73/1.06 |
| 2017/0342933 A1* | 11/2017 | Kamiya | ................ | F02D 41/021 |
| 2018/0024093 A1* | 1/2018 | Watanabe | ......... | G01N 27/4175 205/775 |

FOREIGN PATENT DOCUMENTS

JP 2006-208363 A 8/2006
JP 2011-164035 A 8/2011

* cited by examiner

CONTROLLER AND ABNORMALITY DETECTING METHOD OF AIR-FUEL-RATIO SENSOR

CROSS-REFERENCE TO RELATED APPLICATION

This application is based upon and claims the benefit of priority of the prior Japanese Patent Application No. 2016-142771, filed on Jul. 20, 2016, the entire contents of which are incorporated herein by reference.

FIELD

The embodiment discussed herein is directed to a controller and an abnormality detecting method of an air-fuel-ratio sensor.

BACKGROUND

There is widely known a feedback control that brings an air-fuel ratio, which is a ratio between air and fuel in an exhaust gas exhausted from an internal-combustion engine, close to a target air-fuel ratio so as to improve fuel efficiency of a vehicle, and this air-fuel ratio is detected by an air-fuel-ratio sensor (A/F sensor).

As for an air-fuel-ratio sensor, there is known an air-fuel-ratio sensor that controls a current and a voltage to a plurality of terminals connected with a gas sensor element so as to detect an air-fuel ratio. With regard to this air-fuel-ratio sensor, there is proposed a technology that detects abnormalities of a ground fault and a sky fault of these terminals on the basis of voltages of the terminals connected with the gas sensor element (for example, Japanese Laid-open Patent Publication No. 2005-291991).

However, when states of the voltages of the terminals connected with the gas sensor element are sampled at predetermined time intervals so as to detect an abnormality of a ground fault or a sky fault, a load for detecting the abnormality becomes large.

SUMMARY

According to an aspect of an embodiment, a controller of an air-fuel-ratio sensor includes a control unit, a voltage-abnormality detecting unit, and a short-circuit-abnormality detecting unit. The control unit controls a current and a voltage of a gas sensor element through a plurality of terminals connected with the gas sensor element. The voltage-abnormality detecting unit changes, when at least one of voltages of the plurality of terminals is out of a predetermined range, a voltage level of an output voltage. The short-circuit-abnormality detecting unit causes, when the voltage level of the output voltage changes from a first voltage into a second voltage, the control unit to perform for a predetermined time a protective operation that suppresses currents from the control unit to the plurality of terminals, and detects, when the voltage level of the output voltage is the second voltage after the protective operation is released, a short-circuit abnormality.

BRIEF DESCRIPTION OF DRAWINGS

A more complete appreciation of the disclosed technology and many of the attendant advantages thereof will be readily obtained as the same becomes better understood by reference to the following detailed description when considered in connection with the accompanying drawings, wherein.

DESCRIPTION OF EMBODIMENT

Hereinafter, an embodiment of a controller and an abnormality detecting method of an air-fuel-ratio sensor (A/F sensor) will be described in detail with reference to the accompanying drawings. Moreover, the disclosed technology is not limited to the embodiment described below.

1. Configuration of Air-Fuel-Ratio Sensor

Figure 1:
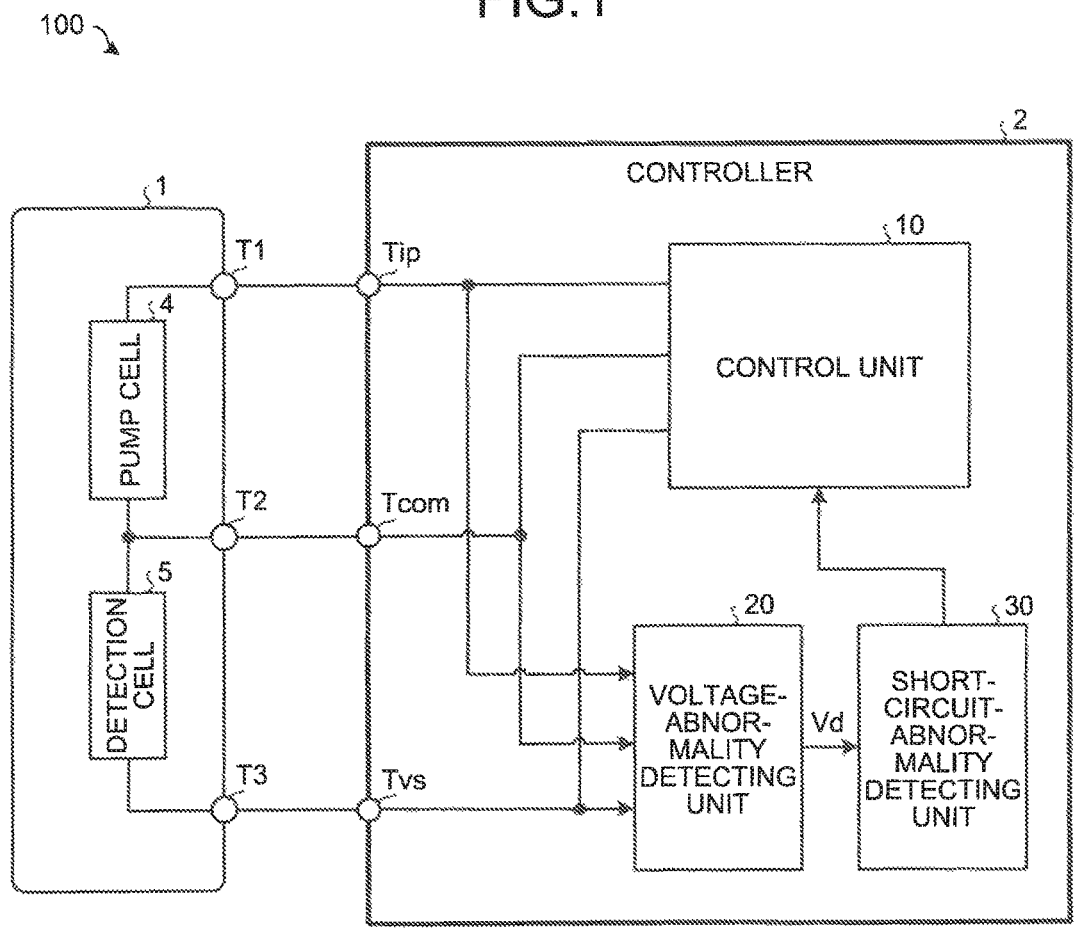
FIG. 1 is a diagram illustrating a configuration example of an air-fuel-ratio sensor according to an embodiment.

FIG. 1 is a diagram illustrating a configuration example of an air-fuel-ratio sensor according to the embodiment of the present disclosure. As illustrated in FIG. 1, an air-fuel-ratio sensor 100 includes a gas sensor element 1 and a controller 2 so as to detect, for example, an oxygen concentration (air-fuel ratio) in an exhaust gas.

The gas sensor element 1 includes a pump cell 4 that pumps and pumps out oxygen into and from a gas detecting chamber (not illustrated) and a detection cell 5 for detecting an oxygen concentration of the gas detecting chamber. The controller 2 includes a terminal Tip, a terminal Tcom, a terminal Tvs, a control unit 10, a voltage-abnormality detecting unit 20, and a short-circuit-abnormality detecting unit 30.

The terminal Tip is connected with one end of the pump cell 4, the terminal Tcom is connected with the other end of the pump cell 4 as well as one end of the detection cell 5, and the terminal Tvs is connected with the other end of the detection cell 5. The control unit 10 controls a current and a voltage of the gas sensor element 1 through the terminal Tip, the terminal Tcom, and the terminal Tvs.

For example, the control unit 10 outputs a voltage so that a voltage Vcom of the terminal Tcom is a constant voltage, and supplies a current Ip from the terminal Tip to the pump cell 4 of the gas sensor element 1 so that a voltage Vs of the terminal Tvs is a predetermined voltage. The control unit 10 computes an air-fuel ratio (hereinafter, may be referred to as "A/F value") on the basis of the current Ip to the pump cell 4.

When at least one of voltages of the plurality of terminals Tip, Tcom, and Tvs (hereinafter, may be collectively referred to as "terminals T") is out of a predetermined range, the voltage-abnormality detecting unit 20 changes a voltage level of an output voltage Vd. A ground fault means that the terminal T is short-circuited with, for example, a reference potential (for example, ground potential), and a sky fault means that the terminal T is short-circuited with, for example, a power-supply potential.

The short-circuit-abnormality detecting unit 30 detects an abnormality (hereinafter, may be referred to as "short-circuit abnormality") of a ground fault or a sky fault of each of the terminals T on the basis of a change in a voltage level of the output voltage Vd output from the voltage-abnormality detecting unit 20 and a subsequent state thereto.

When a voltage level of the output voltage Vd changes from "High" level (one example of "first voltage") to "Low" level (one example of "second voltage"), this short-circuit-abnormality detecting unit 30 causes the control unit 10 to perform a protective operation (hereinafter, may be referred to as "overcurrent protective operation") against an overcurrent as long as a predetermined time. When a voltage level of the output voltage Vd is determined to be "Low" level after the overcurrent protective operation for the predetermined time is released, the short-circuit-abnormality detecting unit 30 detects a short-circuit abnormality.

When a voltage of the terminal T is changed by a noise such as a spike noise, an instantaneous short circuit, and the like, the short-circuit-abnormality detecting unit 30 changes in some cases a voltage level of the output voltage Vd from "High" level to "Low" level. Therefore, when an abnormality of a ground fault or a sky fault is detected by only the change in the voltage level of the output voltage Vd, there exists a fear that the ground fault and the sky fault are erroneously detected. Therefore, the short-circuit-abnormality detecting unit 30 detects abnormalities of a ground fault and a sky fault on the basis of a plurality of determination results, and thus the abnormalities of the ground fault and the sky fault can be detected with high accuracy.

When a voltage level of the output voltage Vd remains at "Low" level after the voltage level of the output voltage Vd changes from "High" level to "Low" level, determination of a short-circuit abnormality by the change in the voltage level of the output voltage Vd is difficult. On the other hand, the short-circuit-abnormality detecting unit 30 performs a level detection that detects whether or not the voltage level of the output voltage Vd is "Low" level, so as to detect a short-circuit abnormality when the voltage level of the output voltage Vd is "Low" level. Thus, abnormalities of a ground fault and a sky fault can be detected with high accuracy.

A voltage of the terminal T continues to fluctuate in some cases for a predetermined time by a noise such as a spike noise, an instantaneous short circuit, and the like, so that a voltage level of the output voltage Vd continues to change in some cases between "High" level and "Low" level. Therefore, when a state of a voltage level of the output voltage Vd is detected immediately after a detection of a change in the voltage level of the output voltage Vd, there exists a fear that a short-circuit abnormality is erroneously detected.

On the other hand, as described above, when the output voltage Vd changes, the short-circuit-abnormality detecting unit 30 causes the control unit 10 to perform the overcurrent protective operation for the predetermined time, and performs the level detection that detects whether or not the voltage level of the output voltage Vd is "Low" level after this overcurrent protective operation is released. Therefore, a time interval can be taken from the change in the voltage level of the output voltage Vd while protecting the control unit 10, so that abnormalities of a ground fault and a sky fault can be detected with high accuracy.

When the overcurrent protective operation is performed, because a voltage of the terminal T having neither of a ground fault and a sky fault becomes inconstant in some cases, the short-circuit-abnormality detecting unit 30 performs, not during the overcurrent protective operation, a process for detecting a short-circuit abnormality on the basis of the output voltage Vd after the overcurrent protective operation is released. Thus, abnormalities of a ground fault and a sky fault can be detected with high accuracy.

When a short-circuit abnormality is to be detected with high accuracy by using only the level detection, a processing load becomes large because the voltage level of the output voltage Vd is to be continuously determined at short time intervals. On the other hand, the short-circuit-abnormality detecting unit 30 performs the level detection after an edge detection that detects a change in the voltage level of the output voltage Vd. Therefore, a processing load can be reduced compared with a case where a short-circuit abnormality is detected by only a level detection.

2. Air-Fuel-Ratio Sensor

Figure 2:
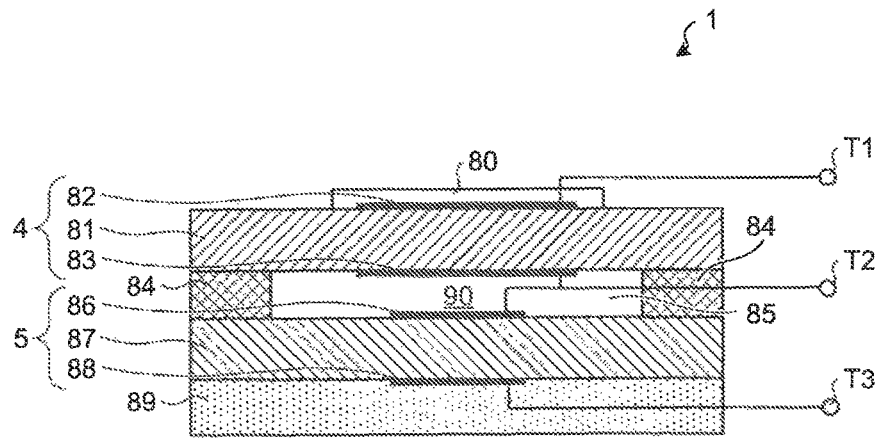
FIG. 2 is a diagram illustrating a configuration example of a gas sensor element illustrated in FIG. 1.
Figure 3:
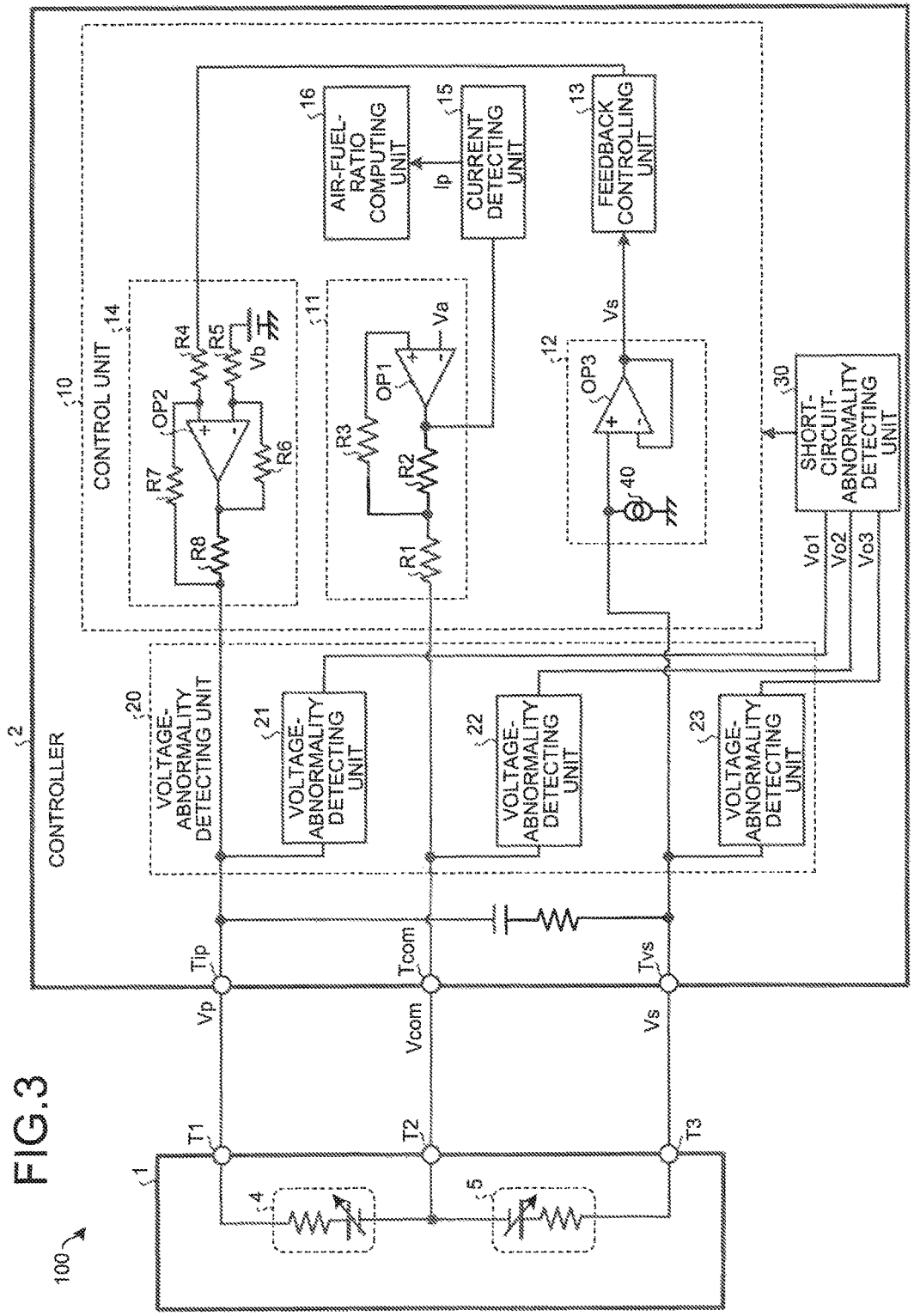
FIG. 3 is a diagram illustrating a configuration example of a controller illustrated in FIG. 1.

Next, a configuration example of the air-fuel-ratio sensor 100 illustrated in FIG. 1 will be explained. FIG. 2 is a diagram illustrating a configuration example of the gas sensor element 1. FIG. 3 is a diagram illustrating a configuration example of the controller 2 illustrated in FIG. 1. The controller 2 of the air-fuel-ratio sensor 100 is arranged in, for example, an Electronic Control Unit (ECU) provided in a vehicle, and the gas sensor element 1 is arranged in, for example, an exhaust pipe of an internal-combustion engine of the vehicle.

2.1. Configuration Example of Gas Sensor Element

First, a configuration example of the gas sensor element 1 will be explained with reference to FIG. 2. The gas sensor element 1 is, for example, a universal air-fuel-ratio gas sensor element, and, as illustrated in FIG. 2, has a configuration in which a solid electrolyte body 81, an insulating substrate 85, and solid electrolyte bodies 87 and 89 are sequentially laminated in this order.

The solid electrolyte bodies 81, 87, and 89 are solid electrolyte bodies having the oxygen ion conductivity, and are formed by adding, for example, yttria (Y2O3) to zirconia (ZrO2). The insulating substrate 85 is made of, for example, alumina and the like.

A gas detecting chamber 90 is formed in the insulating substrate 85, and diffusion controlling units 84, which are porous, are arranged at respective both ends of this gas detecting chamber 90 so as to control an inflow of an exhaust gas into the gas detecting chamber 90.

The pump cell 4 includes the solid electrolyte body 81 and electrodes 82 and 83 that are formed out of porous platinum on respective both surfaces of this solid electrolyte body 81, so as to pump and pump out oxygen into and from the gas detecting chamber 90 in accordance with a magnitude and a direction of a current that is supplied between the electrodes 82 and 83. The electrode 82 is protected by, for example, a protection layer 80 having porous characteristics.

The detection cell 5 includes a solid electrolyte body 87 and electrodes 86 and 88 that are formed out of porous platinum on respective both surfaces of this solid electrolyte body 87. When a constant current Icp is supplied between the electrodes 86 and 88, an electromotive force according to an oxygen concentration in the gas detecting chamber 90 is to be generated between the electrodes 86 and 88.

2.2. Configuration Example of Controller

Next, a configuration example of the controller 2 illustrated in FIG. 3 will be explained. As described above, the controller 2 includes the terminals Tip, Tcom, and Tvs, the control unit 10, the voltage-abnormality detecting unit 20, and the short-circuit-abnormality detecting unit 30.

This controller 2 is realized by an integrated circuit such as an Application Specific Integrated Circuit (ASIC) and a Field Programmable Gate Array (FPGA). Moreover, the controller 2 may employ a configuration that performs all or a part of operation processes by using a Central Processing Unit (CPU). For example, the short-circuit-abnormality detecting unit 30 may be configured by a microcomputer including a CPU, a Read Only Memory (ROM), a Random Access Memory (RAM), and an input/output port (I/O port).

2.2.1. Control Unit

The control unit 10 includes a voltage controlling unit 11, a voltage detecting unit 12, a feedback controlling unit 13, a current supplying unit 14, a current detecting unit 15, and an air-fuel-ratio computing unit 16.

The voltage controlling unit 11 outputs a voltage so that a voltage of a terminal T2 of the gas sensor element 1 is a constant voltage. This voltage controlling unit 11 includes an operational amplifier OP1 and resistances R1 to R3. The voltage controlling unit 11 operates so that a voltage at a connection point between the resistance R1 and the resistance R2 is a constant voltage Va, and supplies the constant voltage Va to the terminal Tcom through the resistance R1. It is sufficient that the voltage controlling unit 11 has a configuration that outputs a voltage so that a voltage of the terminal T2 is a constant voltage, and thus is not limited to the configuration illustrated in FIG. 3.

The voltage detecting unit 12 includes a current source 40 and an operational amplifier OP3. The current source 40 flows the constant current Icp into the detection cell 5. The operational amplifier OP3 functions as a voltage follower, detects an instantaneous value (hereinafter, may be referred to as "VS voltage Vs") of a voltage at the terminal Tvs, and outputs this VS voltage Vs to the feedback controlling unit 13. It is sufficient that the voltage detecting unit 12 has a configuration that flows the constant current Icp and further detects the VS voltage Vs, and thus is not limited to the configuration illustrated in FIG. 3.

The feedback controlling unit 13 generates a control voltage Vcnt according to the VS voltage Vs, which is to be detected by the voltage detecting unit 12, so as to output this control voltage Vcnt to the current supplying unit 14. For example, the feedback controlling unit 13 generates the control voltage Vcnt according to a difference between the VS voltage Vs and a reference voltage value Vref so as to output this control voltage Vcnt to the current supplying unit 14.

The current supplying unit 14 includes resistances R4 to R8 and an operational amplifier OP2 so as to supply the current Ip having a direction and a magnitude according to a difference between the control voltage Vcnt output from the feedback controlling unit 13 and a reference voltage Vb from the terminal Tip to the pump cell 4 of the gas sensor element 1. The current supplying unit 14 is not limited to the circuit illustrated in FIG. 3, it is sufficient that the current supplying unit 14 has a configuration that can supply the current Ip according to a control of the feedback controlling unit 13 to a terminal T1.

The current detecting unit 15 detects an instantaneous value of the current Ip flowed into the pump cell 4 (hereinafter, may be referred to as "IP current Ip"). This current detecting unit 15 detects a value of a both-end voltage Vr2 of the resistance R2 from a difference between an output of the operational amplifier OP1 and the constant voltage Va so as to detect the IP current Ip (=Vr2/R2) from the value of this both-end voltage Vr2. It is sufficient that the current detecting unit 15 has a configuration that detects the IP current Ip, and is not limited to the configuration illustrated in FIG. 3.

Not illustrated in FIG. 3, a current source for flowing the constant current Icp along with the current source 40 is provided in the controller 2 at the terminal Tcom, the constant current Icp is not included in the IP current Ip to be detected by the current detecting unit 15.

The air-fuel-ratio computing unit 16 computes an air-fuel ratio (A/F value) on the basis of the IP current Ip detected by the current detecting unit 15. Thus, the control unit 10 controls the currents and the voltages of the gas sensor element 1 through the plurality of terminals T so as to detect an air-fuel ratio (A/F value).

When the short-circuit-abnormality detecting unit 30 performs an overcurrent protective request, this control unit 10 performs an overcurrent protective operation that suppresses an overcurrent to the terminals Tip, Tcom, and Tvs. For example, the control unit 10 turns outputs from the operational amplifiers OP1 and OP2 into high impedance states, and further turns a current source such as the current source 40 into a high impedance state so as to perform the overcurrent protective operation.

Thus, the terminals Tip, Tcom, and Tvs of the gas sensor element 1 are turned into an high impedance, and an overcurrent to the terminals Tip, Tcom, and Tvs are suppressed. When a constant current of the current source such as the current source 40 is small, a process for turning an impedance of the current source such as the current source 40 higher is not needed to be executed.

It is sufficient that the overcurrent protective operation may be an operation that suppresses an overcurrent to each of the terminals T, and is not limited to the aforementioned configuration. For example, a configuration may be employed, in which a current limiting circuit, which performs a current limitation when an overcurrent protective request is performed by the short-circuit-abnormality detecting unit 30, is arranged in the voltage controlling unit 11 or the current supplying unit 14. When this current limiting circuit operates, each of the terminals T can be turned into a high impedance state in a view from outside of the gas sensor element 1 at a time when a ground fault or a sky fault occurs.

For example, when a ground fault occurs in any one of the terminals T, the control unit 10 may control outputs of the operational amplifiers OP1 and OP2 so that they are equal to a reference potential (for example, ground potential), and when a sky fault occurs in any one of the terminals T, the control unit 10 may control outputs of the operational amplifiers OP1 and OP2 so that they are equal to a power-supply potential, in order to perform the overcurrent protective operation. Thus, the overcurrent protection can be also performed thereby.

2.2.2. Voltage-Abnormality Detecting Unit

The voltage-abnormality detecting unit 20 includes voltage-abnormality detecting units 21 to 23. When a voltage Vp of the terminal Tip is out of a predetermined range, the voltage-abnormality detecting unit 21 changes a voltage level of an output voltage Vo1, which is output to the short-circuit-abnormality detecting unit 30, from "High" level into "Low" level.

When the voltage Vcom of the terminal Tcom is out of a predetermined range, the voltage-abnormality detecting unit 22 changes a voltage level of an output voltage Vo2, which is output to the short-circuit-abnormality detecting unit 30, from "High" level into "Low" level. When the voltage Vs of the terminal Tvs is out of a predetermined range, the voltage-abnormality detecting unit 23 changes a voltage level of an output voltage Vo3, which is output to the short-circuit-abnormality detecting unit 30, from "High" level into "Low" level. The output voltages Vo1 to Vo3 are examples of the aforementioned output voltage Vd, and hereinafter, may be collectively referred to as "output voltages Vo".

Figure 4:
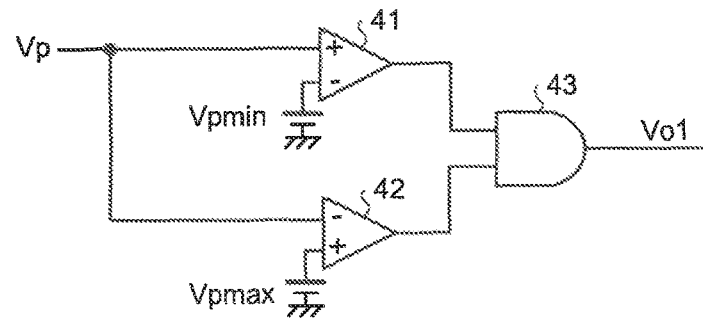
FIG. 4 is a diagram illustrating a configuration example of a voltage-abnormality detecting unit.

FIG. 4 is a diagram illustrating a configuration example of the voltage-abnormality detecting unit 21. As illustrated in FIG. 4, the voltage-abnormality detecting unit 21 includes comparators 41 and 42 and a logical multiplication computing unit 43. When the voltage Vp at the terminal Tip is a lower limit value Vpmin or more, the comparator 41 outputs a "High" level voltage, and when the voltage Vp is less than the lower limit value Vpmin, the comparator 41 outputs a "Low" level voltage.

When the voltage Vp of the terminal Tip is an upper limit value Vpmax or less, the comparator 42 outputs a "High" level voltage, and when the voltage Vp is more than the upper limit value Vpmax, the comparator 42 outputs a "Low" level voltage. The lower limit value Vpmin is higher than a reference potential (for example, ground potential), and the upper limit value Vpmax is lower than a power-supply potential.

The logical multiplication computing unit 43 is, for example, an AND circuit so as to output the output voltage Vo1 according to a logical multiplication between an output of the comparator 41 and an output of the comparator 42. For example, when any one of the output of the comparator 41 and the output of the comparator 42 changes from "High" level into "Low" level, the logical multiplication computing unit 43 changes the output voltage Vo1 from "High" level into "Low" level. Each of the voltage-abnormality detecting units 22 and 23 may employ a configuration similar to that of the voltage-abnormality detecting unit 21, in this case, a lower limit value and an upper limit value, which are according to each of the terminals T, are set.

Thus, when the voltage Vp of the terminal Tip is within a predetermined range (Vmin≤Vp<Vmax), the voltage-abnormality detecting unit 21 changes a voltage level of the output voltage Vo1 into "High" level. When the voltage Vp is out of the predetermined range, the voltage-abnormality detecting unit 21 changes the voltage level of the output voltage Vo1 from "High" level into "Low" level.

Each of the voltage-abnormality detecting units 21 to 23 may employ a configuration that separately outputs an output voltage indicating whether or not a voltage of the terminal T is the lower limit value or less and that indicating whether or not the voltage of the terminal T is more than the upper limit value.

An AND circuit to which the output voltages Vo1 to Vo3 of the voltage-abnormality detecting units 21 to 23 may be provided in the voltage-abnormality detecting unit 22, and an output from this AND circuit may be output to the short-circuit-abnormality detecting unit 30 as the output voltage Vo. Thus, when any one of the output voltages Vo1 to Vo3 changes from "High" level into "Low" level, the output voltage Vo that changes from "High" level into "Low" level can be output to the short-circuit-abnormality detecting unit 30.

2.2.3. Short-Circuit Abnormality Detecting Unit

The short-circuit-abnormality detecting unit 30 causes the control unit 10 to perform an overcurrent protective operation as long as a predetermined time TA on the basis of a change in a voltage level of each of the output voltages Vo1 to Vo3, and detects a short-circuit abnormality on the basis of a state of the voltage level of corresponding one of the output voltages Vo1 to Vo3 after this overcurrent protective operation is released.

For example, when a voltage level of the output voltage Vo1 changes from "High" level into "Low" level, the short-circuit-abnormality detecting unit 30 causes the control unit 10 to perform overcurrent protective operation as long as the predetermined time TA, and when the voltage level of the output voltage Vo1 is "Low" level after this overcurrent protective operation is released, detects a short-circuit abnormality in the terminal Tip. The short-circuit-abnormality detecting unit 30 detects, similarly to the output voltage Vo1, a change in a voltage level and a level state of the output voltage Vo2 and Vo3 so as to detect a short-circuit abnormality in the terminals Tcom and Tvs.

Figure 5:
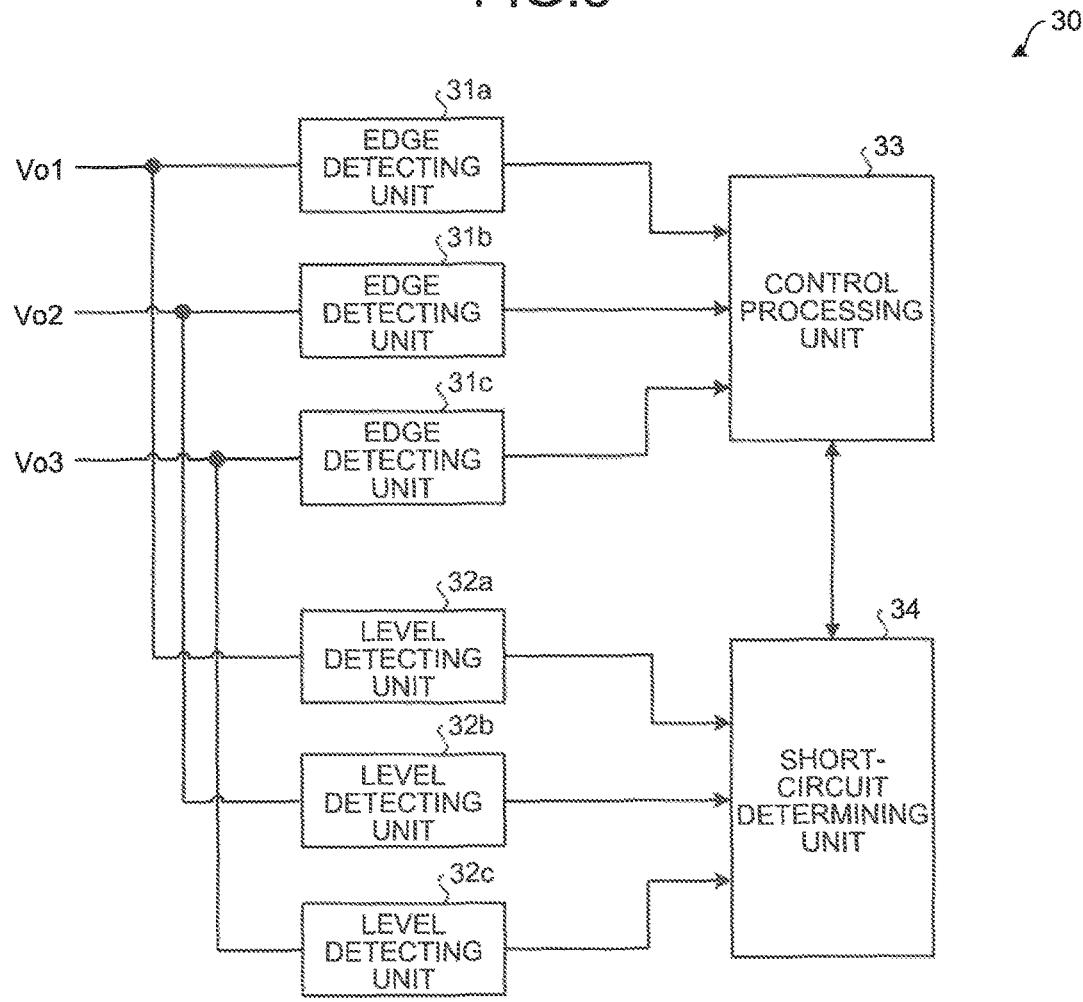
FIG. 5 is a diagram illustrating a configuration example of a short-circuit-abnormality detecting unit.

FIG. 5 is a diagram illustrating a configuration example of the short-circuit-abnormality detecting unit 30. As illustrated in FIG. 5, the short-circuit-abnormality detecting unit 30 includes edge detecting units 31a to 31c (hereinafter, may be collectively referred to as "edge detecting units 31"), level detecting units 32a to 32c (hereinafter, may be collectively referred to as "level detecting units 32"), a control processing unit 33, and a short-circuit determining unit 34.

The edge detecting unit 31a detects a change in a voltage level of the output voltage Vo1 from "High" level into "Low" level, and notifies the control processing unit 33 of this detection result. The edge detecting unit 31b detects a change in a voltage level of the output voltage Vo2 from "High" level into "Low" level, and notifies the control processing unit 33 of this detection result. The edge detecting unit 31c detects a change in a voltage level of the output voltage Vo3 from "High" level into "Low" level, and notifies the control processing unit 33 of this detection result.

The level detecting unit 32a detects a voltage level of the output voltage Vo1, and notifies the short-circuit determining unit 34 of this detection result. The level detecting unit 32b detects a voltage level of the output voltage Vo2, and notifies the short-circuit determining unit 34 of this detection result. The level detecting unit 32c detects a voltage level of the output voltage Vo3, and notifies the short-circuit determining unit 34 of this detection result.

When determining, on the basis of detection results by the edge detecting units 31a to 31c, that any one of voltage levels of the output voltages Vo1 to Vo3 changes from "High" level to "Low" level, the control processing unit 33 performs an overcurrent protective request on the control unit 10 so as to cause the control unit 10 to perform an overcurrent protective operation as long as the predetermined time TA. For example, the control processing unit 33 outputs, to the control unit 10, a protection requesting signal Sp whose level is "High" level as long as the predetermined time TA so as to perform this overcurrent protective request. In this case, when the protection requesting signal Sp is "High" level, the control unit 10 performs an overcurrent protective operation.

Thus, the control unit 10 starts an overcurrent protective operation when the output voltage Vo is changed, a failure caused by an overcurrent can be prevented. When the short-circuit-abnormality detecting unit 30 is configured so that the edge detecting units 31a to 31c are interruption ports and, when a voltage level of any one of the output voltages Vo1 to Vo3 changes from "High" level to "Low" level, an interruption is generated on the control processing unit 33 from corresponding one of the edge detecting units 31a to 31c, a processing load of the short-circuit-abnormality detecting unit 30 can be reduced.

After the predetermined time TA has elapsed, in other words, the overcurrent protective operation is released, the short-circuit determining unit 34 determines whether or not, among the output voltages Vo1 to Vo3, a voltage level of the output voltage Vo (hereinafter, may be referred to as "detection target voltage Vot") whose voltage level has changed from "High" level to "Low" level is "Low" level. When determining that the voltage level of the detection target voltage Vot is "Low" level, the short-circuit determining unit 34 determines that a short-circuit abnormality is generated.

When the overcurrent protective operation is performed by the control unit 10, a voltage of the terminal T not having a ground fault or a sky fault becomes inconstant in some cases. For example, when the terminals T are in high impedance states by the overcurrent protective operation, voltages of the terminals T are inconstant, and thus there exists a probability of a voltage level of the output voltage Vo corresponding to the terminal T not having a ground fault or a sky fault being "Low" level.

Therefore, after the output voltage Vo changes from "High" level into "Low" level caused by an effect of a noise and the overcurrent protective operation is started, when a short-circuit abnormality is determined on the basis of a voltage level of the output voltage Vo during this overcurrent protective operation, there exists a fear that a short-circuit abnormality is erroneously detected.

On the other hand, because the short-circuit-abnormality detecting unit 30 performs a process for detecting a short-circuit abnormality on the basis of the output voltages Vo1 to Vo3 after an overcurrent protective operation is released, abnormalities of a ground fault and a sky fault can be detected with higher accuracy.

The control processing unit 33 does not execute a process in response to a detection result of the edge detecting unit 31 when the control unit 10 is in an overcurrent protective operation. Thus, for example, the control processing unit 33 can be prevented from performing a process caused by an unneeded interruption when the edge detecting units 31a to 31c are used as interruption ports, and thus a processing load of the short-circuit-abnormality detecting unit 30 can be reduced and an erroneous detection of a short-circuit abnormality can be prevented.

Figure 6:
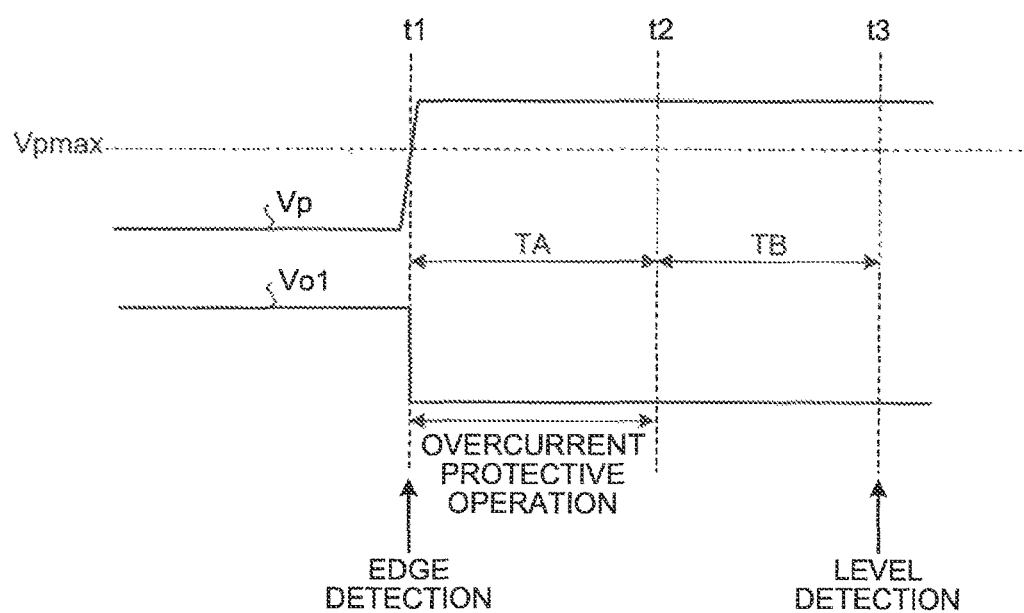
FIG. 6 is a diagram illustrating changes in a voltage of a terminal and an output voltage when a sky fault of the terminal occurs.

FIG. 6 is a diagram illustrating changes in the voltage Vp of the terminal Tip and the output voltage Vo1 when a sky fault of the terminal Tip occurs. As illustrated in FIG. 6, at a timing (time t1) when a sky fault of the terminal Tip occurs and the voltage Vp of the terminal Tip exceeds the upper limit value Vpmax, the output voltage Vo1 to be output from the voltage-abnormality detecting unit 21 changes from "High" level into "Low" level. Thus, the edge detecting unit 31a detects the change in the output voltage Vo1, and the control processing unit 33 causes the control unit 10 to perform an overcurrent protective operation so as to set an internal timer so that a timer trigger is generated after the predetermined time TA has elapsed.

The control processing unit 33 releases the overcurrent protective operation, on the basis of the timer trigger, at a timing (time t2) when the predetermined time TA has elapsed from the time when the change in the output voltage Vo1 is detected. The short-circuit determining unit 34 determines whether or not a voltage level of the output voltage Vo1 is "Low" level, at a timing (time t3) when a predetermined time TB has elapsed from the timing (time t2) when the overcurrent protective operation is released.

The predetermined time TB is set to be, for example, a time period that is longer than a time period for a completion of a shift to an normal operation from the overcurrent protective operation, and is shorter than a time period to be spent for generation of a failure in the control unit 10 caused by an overcurrent due to a ground fault or a short circuit. Thus, in a state where an operation of the control unit 10 is in a stable state, and further before a failure in the control unit 10 is generated by an overcurrent, a voltage level of the output voltage Vo1 can be reliably detected.

At the time t3, when a voltage level of the output voltage Vo1 is "Low" level, the short-circuit determining unit 34 determines that a short-circuit abnormality is generated, and when the voltage level of the output voltage Vo1 is "High" level, the short-circuit determining unit 34 determines that no short-circuit abnormality is generated.

Thus, the short-circuit-abnormality detecting unit 30 determines, after a voltage level of the output voltage Vo1 changes from "High" level into "Low" level, whether or not the voltage level of the output voltage Vo1 is "Low" level, so as to determine a short-circuit abnormality. Therefore, a processing load of the short-circuit-abnormality detecting unit 30 can be reduced compared with a case where, for example, a short-circuit abnormality is detected by using only a level detection, in other words, a voltage level of the output voltage Vo1 is repeatedly sampled at predetermined time intervals, so as to determine a short-circuit abnormality.

When the terminal Tip has a ground fault or a sky fault, because a voltage level of the output voltage Vo1 remains "Low" level during an overcurrent protection, determining a short-circuit abnormality by using a change in the voltage level of the output voltage Vo1 is difficult. On the other hand, because the short-circuit-abnormality detecting unit 30 detects a short-circuit abnormality when a voltage level of the output voltage Vo1 is "Low" level, abnormalities of a ground fault and a sky fault can be detected with high accuracy.

The short-circuit determining unit 34 can detect a voltage level of the output voltage Vo1 at predetermined time intervals until a predetermined time TC has elapsed from the time t3, and when this voltage level is continuously "Low" level for a predetermined number of times, the short-circuit determining unit 34 can determine that a short-circuit abnormality is generated. A time period of the predetermined time TC from the time t2 is shorter than a time period needed for generation of a failure in the control unit 10 caused by an overcurrent by a ground fault or a short circuit.

The control processing unit 33 can cause the control unit 10 to repeatedly perform the overcurrent protective operation for the predetermined time TA at intervals of a predetermined time TD (TD≥TB). In this case, the short-circuit determining unit 34 can detect a voltage level of the output voltage Vo1 at each time when the predetermined time TB has elapsed after the overcurrent protective operation is released, and when this voltage level is continuously "Low" level for a predetermined number of times, the short-circuit determining unit 34 can determine that a short-circuit abnormality is generated.

Figure 7:
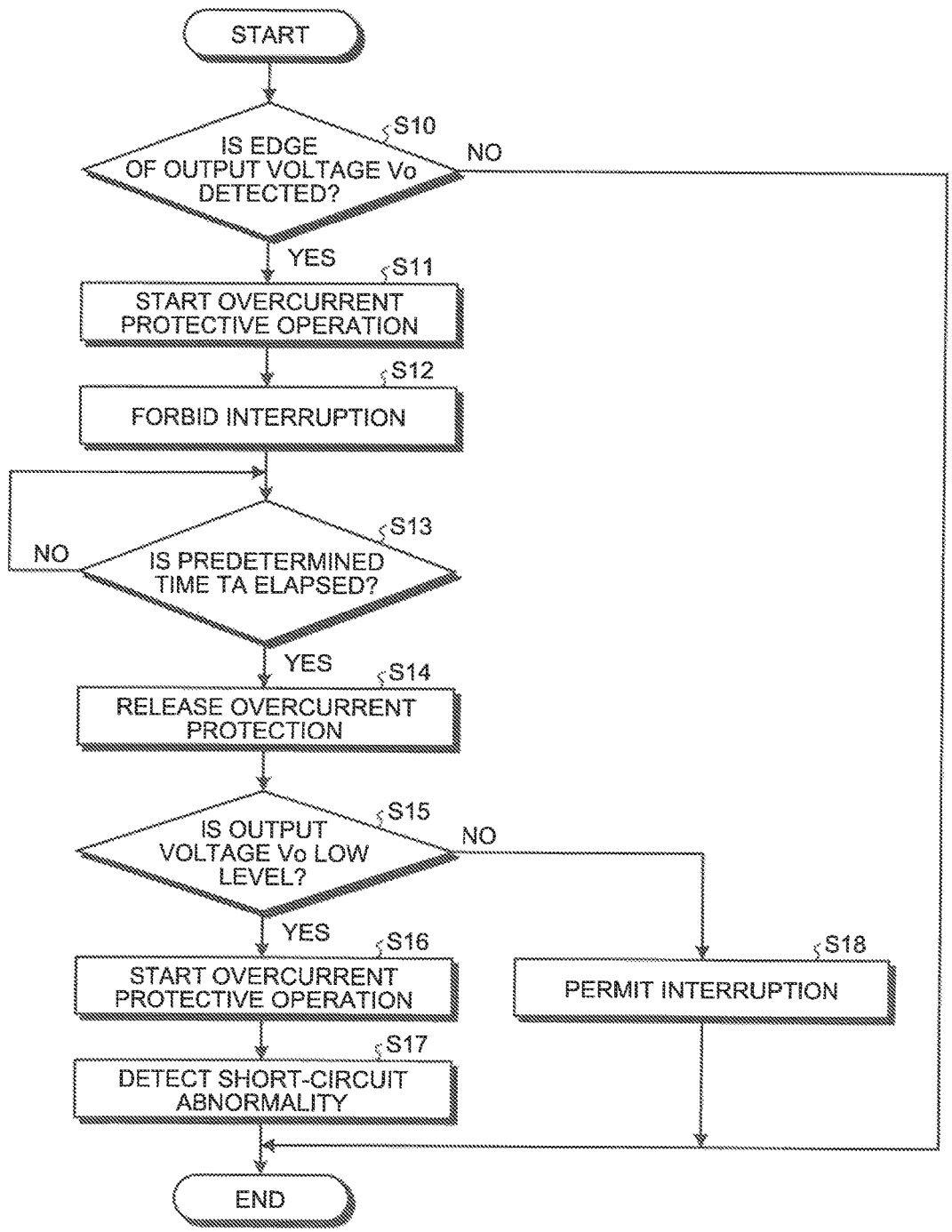
FIG. 7 is a flowchart illustrating one example of a short-circuit-abnormality detecting process that is executed by the short-circuit-abnormality detecting unit.

3. Short-Circuit-Abnormality Detecting Process Flow of Short-Circuit Abnormality Detecting Unit Next, one example of a short-circuit-abnormality detecting process flow of the short-circuit-abnormality detecting unit 30 will be explained by using a flowchart. FIG. 7 is a flowchart illustrating one example of a short-circuit-abnormality detecting process that is executed by the short-circuit-abnormality detecting unit 30.

As illustrated in FIG. 7, the control processing unit 33 of the short-circuit-abnormality detecting unit 30 determines whether or not an edge of the output voltage Vo is detected, in other words, whether or not there exists a change in a voltage level of the output voltage Vo from "High" level into "Low" level (Step S10).

When determining that an edge of the output voltage Vo occurs (Step S10: Yes), the control processing unit 33 causes the control unit 10 to start an overcurrent protective operation (Step S11), and forbids a process in response to an interruption from the voltage-abnormality detecting unit 21

(Step S12). The control processing unit 33 determines whether or not the predetermined time TA has elapsed from a time when the overcurrent protective operation started (Step S13), and when determining that the predetermined time TA has elapsed (Step S13: Yes), the control processing unit 33 causes the control unit 10 to release the overcurrent protective operation (Step S14).

Next, the short-circuit determining unit 34 of the short-circuit-abnormality detecting unit 30 determines whether or not a voltage level of the output voltage Vo after the predetermined time TB from the time when the overcurrent protective operation has released is "Low" level (Step S15). When the short-circuit determining unit 34 determines that the voltage level of the output voltage Vo is "Low" level (Step S15: Yes), the control processing unit 33 causes the control unit 10 to start an overcurrent protective operation (Step S16), and the short-circuit determining unit 34 detects that a short-circuit abnormality is generated (Step S17).

On the other hand, when the short-circuit determining unit 34 determines that the voltage level of the output voltage Vo is not "Low" level (Step S15: No), the control processing unit 33 permits a process in response to an interruption from the voltage-abnormality detecting unit 21 (Step S18), and causes the control unit 10 to release the overcurrent protective operation (Step S19).

When no edge of the output voltage Vo is determined to occur (Step S10: No), or when the process of Step S19 is completed, the short-circuit-abnormality detecting unit 30 repeatedly performs the processes illustrated in FIG. 7.

Moreover, when a voltage of the terminal T is out of a predetermined range, the aforementioned voltage-abnormality detecting unit 20 changes the output voltage Vo from "High" level into "Low" level, however, not limited thereto. For example, the voltage-abnormality detecting unit 20 may be configured so that, when the voltage of the terminal T is out of the predetermined range, the voltage-abnormality detecting unit 20 changes the output voltage Vo from "Low" level into "High" level.

In this case, when the output voltage Vo is changed from "Low" level into "High" level, the short-circuit-abnormality detecting unit 30 causes the control unit 10 to perform an overcurrent protective operation as long as the predetermined time TA, and when the output voltage Vo is "High" level after the overcurrent protective operation has released, the short-circuit-abnormality detecting unit 30 determines that a short-circuit abnormality is generated.

Moreover, the aforementioned controller 2 controls the gas sensor element 1 having the three terminals, the controller 2 may be configured to control a gas sensor element having two terminals. In this case, the controller 2 may execute the aforementioned processes on voltages of the two terminals T.

Moreover, the aforementioned short-circuit-abnormality detecting unit 30 executes the processes associated with the short-circuit abnormality on the basis of changes and states of a voltage level of each of the output voltages Vo, however, not limited thereto. For example, when the voltage levels of two or more of the output voltages Vo are changed simultaneously, the short-circuit-abnormality detecting unit 30 may determine that a short-circuit abnormality is generated, without determining a detection result of the level detecting unit 32.

As described above, the air-fuel-ratio sensor 100 includes the control unit 10, the voltage-abnormality detecting unit 20, and the short-circuit-abnormality detecting unit 30. The control unit 10 controls a current and a voltage of the gas sensor element 1 through the plurality of terminals T connected with the gas sensor element 1. The voltage-abnormality detecting unit 20 changes, when at least one of voltages of the plurality of terminals T is out of a predetermined range, a voltage level of the output voltage Vo. The short-circuit-abnormality detecting unit 30 causes, when the voltage level of the output voltage Vo changes from a first voltage (for example, "High" level) to a second voltage (for example, "Low" level), the control unit 10 to perform for the predetermined time TA an overcurrent protective operation that suppresses currents from the control unit 10 to the plurality of terminals T, and determines, when the voltage level of the output voltage Vo is the second voltage after the overcurrent protective operation is released, a short-circuit abnormality. Thus, for example, a short-circuit abnormality can be detected with high accuracy while reducing a processing load compared with a case where a short-circuit abnormality is detected by using only a level detection. A state of the voltage level of the output voltage Vo is detected after the overcurrent protective operation has been performed, and thus the voltage level of the output voltage Vo can be reliably detected by the time when the control unit 10 fails due to an overcurrent.

The control unit 10 turns the plurality of terminals T into high impedance states to perform the overcurrent protective operation. Thus, a failure in the control unit 10 can be more appropriately prevented, and a short-circuit abnormality detection after an overcurrent protective operation is released can be performed with high accuracy.

The short-circuit-abnormality detecting unit 30 includes the edge detecting unit 31, the level detecting unit 32, the control processing unit 33, and the short-circuit determining unit 34. The edge detecting unit 31 detects a change in the voltage level of the output voltage Vo. The level detecting unit 32 detects a state of the voltage level the output voltage Vo. The control processing unit 33 causes, when a change in the voltage level of the output voltage Vo from the first voltage to the second voltage is detected the edge detecting unit 31, the control unit 10 to perform the overcurrent protective operation for the predetermined time TA. The short-circuit determining unit 34 determines, when the level detecting unit 32 determines that the voltage level of the output voltage Vo is the second voltage after the overcurrent protective operation is released, that there exists the short-circuit abnormality. Thus, for example, the short-circuit-abnormality detecting unit 30 is configured so that the edge detecting unit 31 is an interruption port and an interruption is generated from the edge detecting unit 31 to the control processing unit 33 when the voltage level of the output voltage Vo changes, and thus a processing load of the short-circuit-abnormality detecting unit 30 can be reduced.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A controller of an air-fuel-ratio sensor, the controller being configured to:
control a current and a voltage of a gas sensor element through a plurality of terminals connected with the gas sensor element;
change, when at least one of voltages of the plurality of terminals is out of a predetermined range, a voltage level of an output voltage;
when the voltage level of the output voltage changes from a first voltage into a second voltage, perform for a predetermined time a protective operation that suppresses currents from the controller to the plurality of terminals, and detect, when the voltage level of the output voltage is the second voltage after the protective operation is released and a shift to a normal operation has been completed, a short-circuit abnormality; and turn the plurality of terminals into high impedance states to perform the protective operation, while continuing current supplied by an operational amplifier to the terminals.

2. The controller of the air-fuel-ratio sensor according to claim 1, wherein the controller is further configured to:

detect a change in the voltage level of the output voltage;

detect a state of the voltage level of the output voltage;

when a change in the voltage level of the output voltage from the first voltage into the second voltage is detected, perform the protective operation for the predetermined time; and determine, when the voltage level of the output voltage is determined to be the second voltage after the protective operation is released, that there exists the short-circuit abnormality.

3. An abnormality detecting method of an air-fuel-ratio sensor comprising:

changing a voltage level of an output voltage when at least one of voltages of a plurality of terminals connected with a gas sensor element is out of a predetermined range;

suppressing, when the voltage level of the output voltage is changed, currents to the plurality of terminals for a predetermined time;

detecting a short-circuit abnormality based on a state of the voltage level of the output voltage after the suppressing is released and a shift to a normal operation has been completed; and turning the plurality of terminals into high impedance states to perform the protective operation, while continuing current supplied by an operational amplifier to the terminals.

* * * * *